(12) United States Patent
Monthioux et al.

(10) Patent No.: US 9,048,057 B2
(45) Date of Patent: Jun. 2, 2015

(54) ELECTRON GUN EMITTING UNDER HIGH VOLTAGE, IN PARTICULAR FOR ELECTRON MICROSCOPY

(75) Inventors: Marc Monthioux, Aussonne (FR); Florent Houdellier, Calmont (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 13/823,506

(22) PCT Filed: Sep. 16, 2011

(86) PCT No.: PCT/FR2011/052135
§ 371 (c)(1),
(2), (4) Date: May 29, 2013

(87) PCT Pub. No.: WO2012/035277
PCT Pub. Date: Mar. 22, 2012

(65) Prior Publication Data
US 2013/0234025 A1    Sep. 12, 2013

(30) Foreign Application Priority Data
Sep. 17, 2010  (FR) ..................... 10 03696

(51) Int. Cl.
| H01J 29/48 | (2006.01) |
| H01J 1/304 | (2006.01) |
| H01J 3/02 | (2006.01) |
| H01J 37/073 | (2006.01) |
| H01J 37/28 | (2006.01) |
| H01J 9/02 | (2006.01) |
| B82Y 20/00 | (2011.01) |

(52) U.S. Cl.
CPC ............ *H01J 29/485* (2013.01); *H01J 1/3044* (2013.01); *H01J 3/022* (2013.01); *H01J 37/073* (2013.01); *H01J 37/28* (2013.01); *H01J 2201/30411* (2013.01); *H01J 2201/30415* (2013.01); *H01J 2201/30426* (2013.01); *H01J 2201/30434* (2013.01); *H01J 2201/30469* (2013.01); *H01J 2237/06316* (2013.01); *H01J 2237/06341* (2013.01); *H01J 2237/26* (2013.01); *B82Y 20/00* (2013.01); *H01J 9/025* (2013.01)

(58) Field of Classification Search
None
See application file for complete search history.

(56) References Cited

U.S. PATENT DOCUMENTS

| 6,924,003 | B2* | 8/2005 | Zhang | 427/374.1 |
| 6,930,313 | B2* | 8/2005 | Fujieda et al. | 250/423 R |
| 7,579,764 | B2* | 8/2009 | Wei et al. | 313/311 |
| 7,785,165 | B2* | 8/2010 | Wei et al. | 445/51 |
| 7,828,622 | B1* | 11/2010 | Brodie et al. | 445/50 |
| 7,847,273 | B2* | 12/2010 | Nguyen et al. | 250/493.1 |
| 7,879,308 | B1* | 2/2011 | Chow et al. | 423/447.8 |

(Continued)

OTHER PUBLICATIONS

International Search Report Issued Dec. 2, 2011 in PCT/FR11/052135 Filed Sep. 16, 2011.

*Primary Examiner* — Andrew Smyth
(74) *Attorney, Agent, or Firm* — Oblon, McClelland, Maier & Neustadt, L.L.P.

(57) ABSTRACT

A field-emission electron gun including an electron emission tip, an extractor anode, and a mechanism creating an electric-potential difference between the emission tip and the extractor anode. The emission tip includes a metal tip and an end cone produced by chemical vapor deposition on a nanofilament, the cone being aligned and welded onto the metal tip. The electron gun can be used for a transmission electron microscope.

16 Claims, 3 Drawing Sheets

(56) References Cited

U.S. PATENT DOCUMENTS

Figure 1:
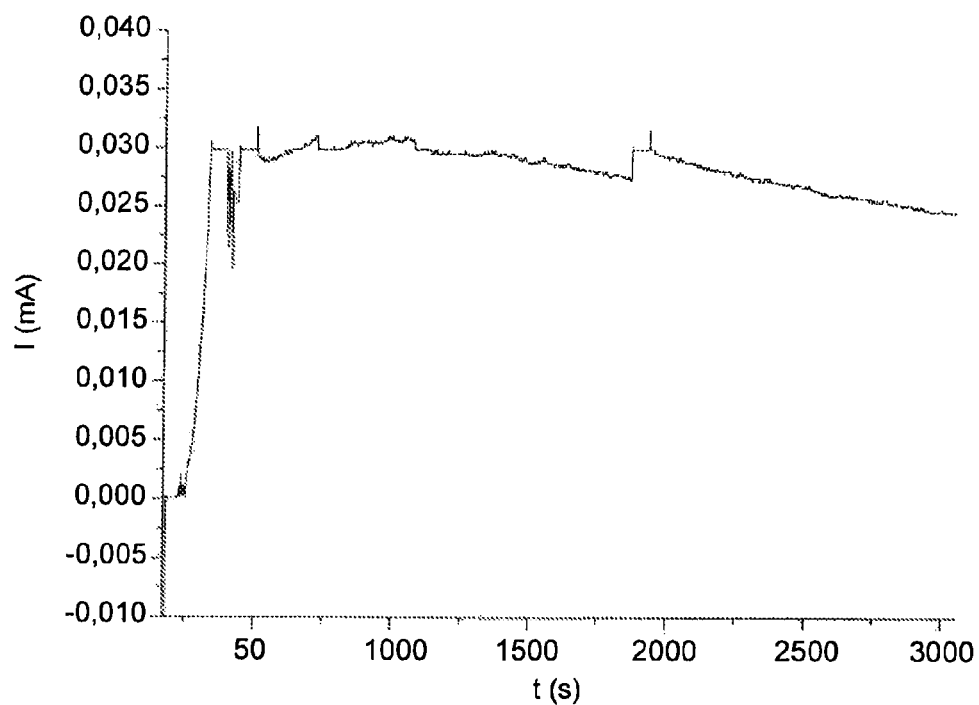

| | | | |
|---|---|---|---|
| 8,164,071 B2* | 4/2012 | Drexel et al. | 250/423 F |
| 2001/0004471 A1* | 6/2001 | Zhang | 427/372.2 |
| 2006/0231773 A1* | 10/2006 | Katagiri et al. | 250/492.1 |
| 2006/0261270 A1* | 11/2006 | Burkhardt et al. | 250/311 |
| 2007/0102650 A1* | 5/2007 | Katagiri et al. | 250/492.3 |
| 2007/0236126 A1* | 10/2007 | Wei et al. | 313/311 |
| 2008/0029700 A1* | 2/2008 | Fujieda et al. | 250/310 |
| 2008/0067407 A1* | 3/2008 | Fujieda et al. | 250/423 F |
| 2008/0242401 A1* | 10/2008 | Jaffe | 463/25 |
| 2008/0287030 A1* | 11/2008 | Kim et al. | 445/46 |
| 2008/0315122 A1* | 12/2008 | Katagiri et al. | 250/492.1 |
| 2009/0252887 A1* | 10/2009 | Barker et al. | 427/523 |
| 2009/0263310 A1* | 10/2009 | Dai et al. | 423/447.3 |
| 2010/0190407 A1* | 7/2010 | Wei et al. | 445/23 |
| 2011/0180385 A1* | 7/2011 | Imholt | 204/157.15 |

* cited by examiner

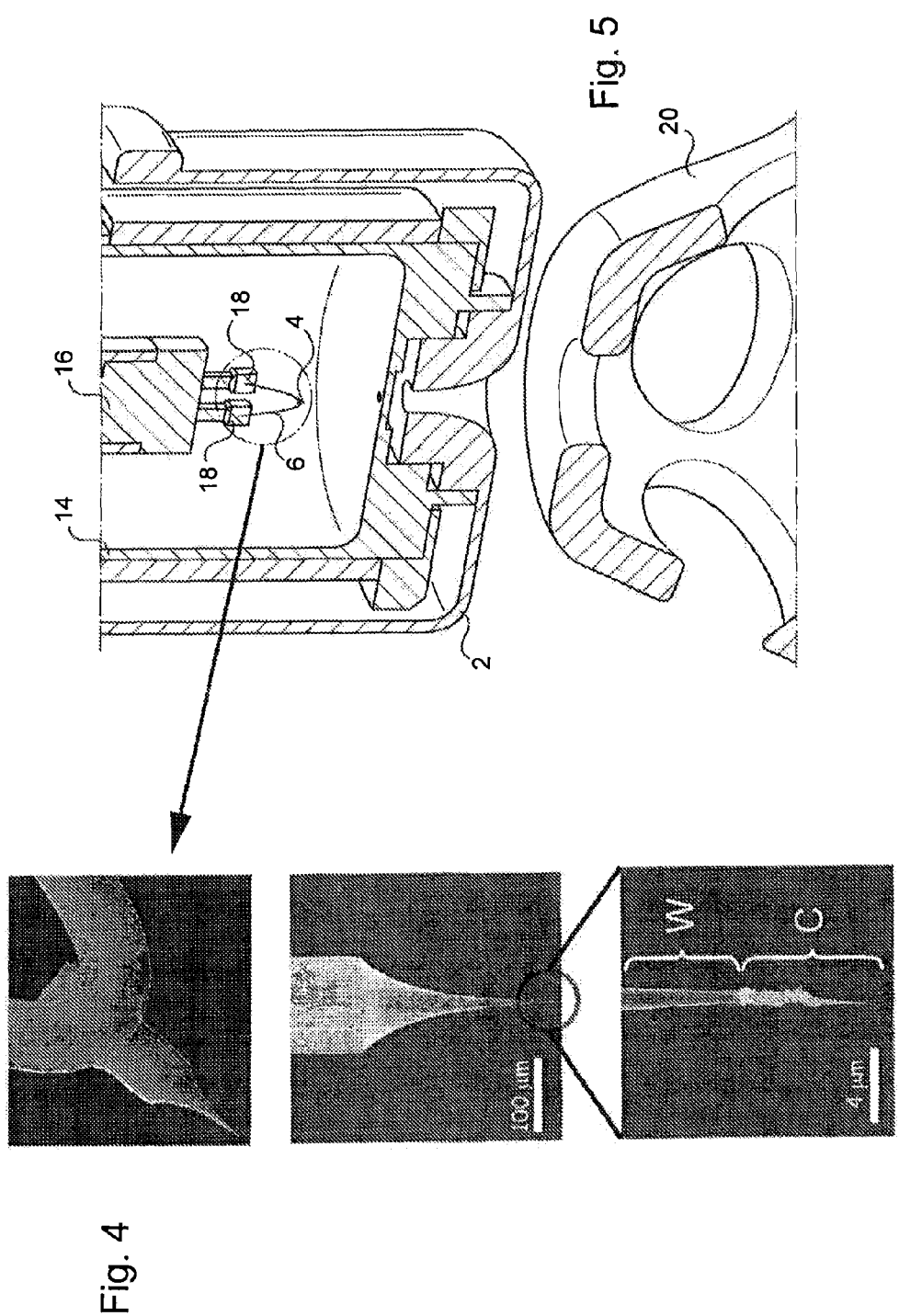

ELECTRON GUN EMITTING UNDER HIGH VOLTAGE, IN PARTICULAR FOR ELECTRON MICROSCOPY

The present invention concerns an electron gun emitting under high voltage and adapted in particular for electron microscopy The principle of electron microscopy is to use an electron beam instead of the light beam used in optical microscopy. The wavelength associated with the electron beam makes it possible to obtain a substantially higher resolution in electron microscopy than that obtained in optical microscopy. However, constraints are linked with the use of electrons. In particular there should be a high vacuum inside the microscope. An electron source is then focused on the sample to observe via electromagnetic lenses. For transmission electron microscopy (different from scanning electron microscopy) the samples used must be ultrathin in order to be as transparent as possible to the electrons, and only the electrons that pass through the sample are analyzed. A distinction is thus made between three types of electrons: the transmitted electrons which have not interacted with the sample, the electrons scattered without energy loss further to an interaction with the atoms of the sample and the electrons scattered with energy loss further to the interaction of the incident electrons with the electron cloud of the atoms of the sample. The analysis of the beams of transmitted electrons and of the beams of scattered electrons makes it possible to create the contrast of the images obtained in transmission electron microscopy (also called TEM).

The present invention concerns a microscope enabling the utilization of the principle of electron microscopy, particularly for example in transmission electron microscopy, and more particularly an electron gun used in such a microscope, that is to say the device enabling an electron beam to be emitted onto a sample to observe. The invention also concerns other apparatuses for viewing or processing that involve one, or several, electron sources for example such as a scanning electron microscope, a nanoetching device of FIB type (FIB standing for Focused Ion Beam), or an electron beam nanolithography device.

There are two main families of electron guns. A distinction is made between hot-cathode electron guns and cold-cathode electron guns.

Hot-cathode electron guns use the Joule effect to extract electrons from a filament, generally a filament of tungsten or of lanthanum hexaboride. In this family, thermionic emission guns have a V-shaped metal tip which is heated to a high temperature. On account of this, the electrons present in the metal move at high velocity. The electrons arriving at the tip of the V are then ejected from the metal. A high potential difference is applied in order to accelerate the electrons that have left the metal. These electrons are attracted towards the anode in the direction of the sample to observe.

A drawback of this type of electron gun is the lack of spatial and temporal coherence of the electron beam obtained. As regards the temporal coherence, the kinetic energy, and thus the velocity, of the emitted electrons is spread according to a Gaussian distribution. Higher chromatic aberration is observed for tungsten filaments than for lanthanum hexaboride which are however much more expensive. As regards the spatial coherence, this remains very limited due to the large extent of the surface for emission of the electrons at the end of the filament.

Another family of electron guns are field emission guns, also called cold-cathode guns. In this family of electron guns, electrons are pulled away by the tunnel effect from a from a fine metal tip, generally of tungsten, said metal tip being subjected to a high electrical field (potential difference of the order of 2 to 7 kV).

In general, such an electron source (with a cold cathode) has a low energy variability and thus much better temporal coherence than the hot-cathode electron sources Furthermore, a field emission source is practically at a point which considerably improves the spatial coherence. It is therefore of much higher brilliance than the hot-cathode sources. However, these cold-cathode sources require an extremely high vacuum. Without the presence of such a vacuum, the tip of the gun oxidizes and the emission effect reduces.

Variants of electron guns also exist. Thermo-assisted field emission guns may thus be cited. There are also field effect guns known as Schottky guns. Such a gun has a larger tip which has a layer of zirconia ($ZrO_2$) at the surface. The zirconia presents lower electron work function than tungsten (which increases the emission of the electrons) and enables a wider tip to be used. The latter type of gun enables a good level of brilliance to be obtained.

Whatever the nature of the source of electrons, once these have been extracted from the source they are accelerated by a voltage applied between the cathode and an accelerating anode. In scanning electron microscopes, this voltage is of the order of 1 to 30 kV. In transmission electron microscopes, this voltage may attain 300 kV or more.

In the field of electron holography, and in particular dark field holography, good performance is necessary, in particular in terms of intensity, brilliance and coherence The electron sources described above have limited performance. The present invention is thus directed to providing an electron source providing a beam that is at the same time intense, brilliant and above all coherent so as to enable the resolution and the field of holographic images to be improved.

The technical problem is thus to obtain, under severe conditions, an electron gun for electron microscopy working in an ultra-high vacuum, continuously, under very high voltage, and while at the same time preferably giving high brilliance, high intensity, low energy dispersion, and high spatial coherence with stable and sustainable characteristics.

To that end, the present invention provides a field emission electron gun comprising a supported electron emitter tip, an extractor anode, as well as means enabling creation of an electric potential difference between the emitter tip and the extractor anode.

According to the present invention, the emitter tip comprises a single conductive tip support, for example a metal tip, and a single end cone obtained by chemical vapor deposition on a nanofiber, the cone being aligned with and bonded to the conductive tip support.

Such a structure principally enables excellent spatial coherence of an electron beam to be obtained. The dimensions of the end of the tip may be very substantially reduced relative to the ends of emitter tips of the prior art guns.

In an electron gun according to the present invention, the end cone used enables good performance to be obtained if it is a cone the material of which is chosen from the group of materials comprising carbon and the materials described or represented by the formula $C_xB_yN_z$, C corresponding to carbon, B to boron and N to nitrogen. As regards the nanofiber, it is for example a nanofiber the material of which is chosen from the group of materials comprising carbon, the materials described or represented by the formula $C_xB_yN_z$, C corresponding to carbon, B to boron and N to nitrogen, and the materials described or represented by the formula $Si_xO_y$, Si corresponding to silicon and O to oxygen. However, it may also be provided to have a nanofiber produced from a different material, where that material is compatible with a chemical vapor deposition process.

To obtain good performance, the nanofiber is advantageously a carbon nanotube the diameter of which is less than 20 nm, preferably less than 10 nm (1 nm=$10^{-9}$ m). The diameter of the tube corresponds to the diameter of the end, or apex, of the emitter tip, here the end of the cone of carbon (or other material).

In the electron gun according to the invention, it may be provided that the conductive point support is of tungsten since it is possible to form a good bond between tungsten and carbon. It may also be provided for the support for the tip to be a metal filament, for example of tungsten. The support could also be formed by two microelectrodes or another support device.

The end cone used in an electron gun according to the present invention is for example of a length comprised between 0.5 and 10 μm (1 μm=$10^{-6}$ m).

As already mentioned above in the introduction, field emission or cold-cathode electron guns require an extremely high vacuum to be produced. It is advantageous here to use for example an NEG pump (NEG standing for Non-Evaporable Getter) to produce the vacuum in a chamber in which the emitter tip and the extractor anode are situated.

The present invention also concerns a transmission electron microscope comprising an electron gun as well as a column containing various parts such as electro-optical components and means for accelerating the electrons emitted by the electron gun, characterized in that the electron gun is an electron gun as described above.

The present invention also concerns any other device comprising an electron gun as described above, in particular a scanning electron microscope or an etching device comprising such a gun or a localized electron irradiating device, in particular such as a nanoetching or nanolithography device provided with such a gun.

The acceleration means for a microscope according to the present invention may comprise means enabling an electric potential difference of 200 kV or more to be created. Of course, lower potential differences may also be envisioned.

Figure 2:
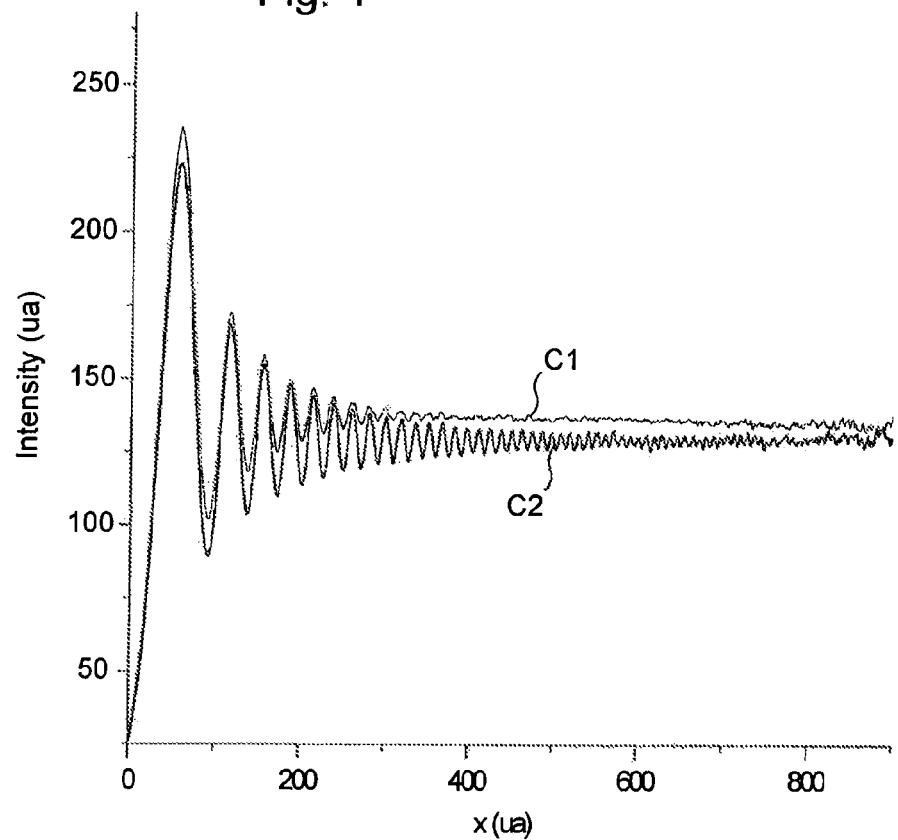
Figure 3:
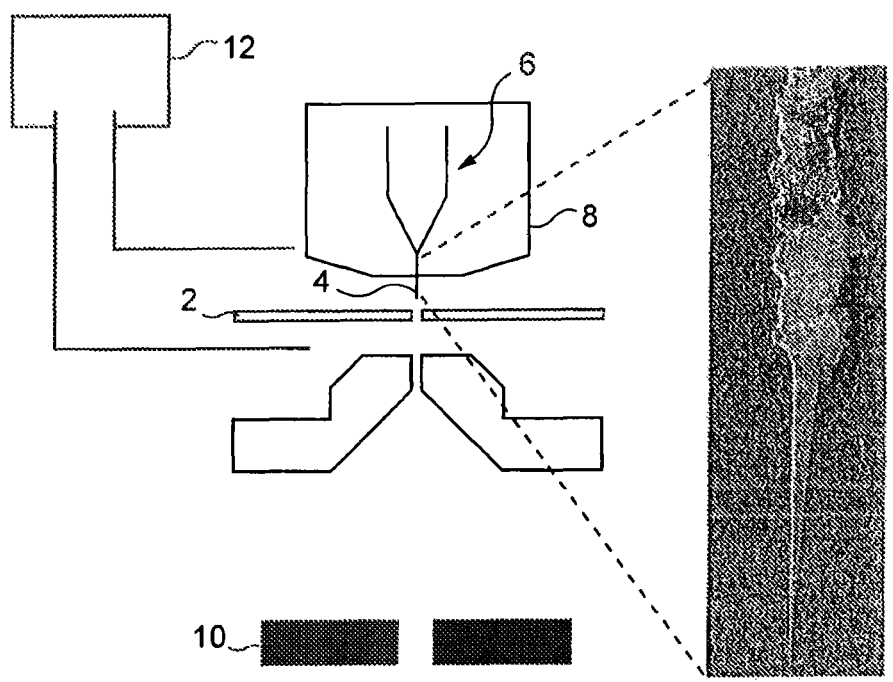

Details and advantages of the present invention will emerge more clearly from the following description, which is made with reference to the accompanying diagrammatic drawings in which:

FIG. 1 is a diagram illustrating the stability over time of an electron beam obtained with an electron gun according to the present invention, FIG. 2 illustrates the difference in spatial coherence of an electron beam obtained with an electron gun according to the present invention and a gun of the same type but with a conventional tungsten tip, FIG. 3 is a diagram of a gun according to the present invention with an enlargement showing a cone used in such a gun, and FIG. 4 is a partial view in perspective and in cross-section of an embodiment of an electron gun according to the present invention with three photographs illustrating the connection between a filament and a tip support, the free end of the tip support and a connection between the end of the tip support with a carbon cone.

The present invention more particularly concerns electron microscopy, in particular transmission or scanning electron microscopy. In this field, the present invention provides a new electron gun enabling very advantageous performance to be obtained for an electron microscope using such an electron gun. On account of this, the present invention has applications in for example the field of spectroscopy, holography and dark field holography. It also concerns the field of nanoetching.

An electron gun according to the present invention is of the FEG type (FEG standing for Field Emission Gun). In such a gun, the electrons are extracted from a metal filament, for example of tungsten, by an extraction force of an electric field existing between the filament and an anode. The field emission principle is used here, also called the tunnel effect. The extraction of electrons is carried out under a vacuum. The extraction voltage is generally comprised between 2000 and 7000 V (i.e. between 2 and 7 kV).

The present invention is preferably used in a cold-cathode field emission gun. In this case, the filament is not heated and the emission of electrons is pure field emission.

The invention provides here to use a structure known as cold-cathode field emission gun (FEG) by modifying the emitter tip of the tungsten filament. Whereas the emitter tip of an electron gun of the prior art is generally produced from tungsten, it is provided here, in a preferred embodiment of the present invention, to use a carbon-on-nanotube cone.

The end of an emitter tip is ideally formed from a single atom. However, it is not known how to produce such a tip. The known tungsten tips generally have an apex, that is to say the most distal region of the tip, which has dimensions of the order of 50 to 100 nm (1 nm=$10^{-9}$ m).

As for the present invention, it provides for the use of a cone for emitting the electrons of which the apex has a diameter of the order of the nanometer.

It is already known to use a chemical vapor deposition technique also called "time-of-flight" to produce carbon cones which are supported by carbon nanofibers. However, it may be provided to have nanofibers of a nature other than carbon-based. They may for example be silicon-based. Nanofibers doped with boron ($C_xB_y$ system), may also be provided, or another possibility is carbon-based nanofibers doped with nitrogen ($C_xN_y$ system), or more generally nanofibers belonging to the system $C_xB_yN_z$.

Similarly for the cones, cones may be provided of carbon as indicated above but also carbon cones doped with boron ($C_xB_y$ system), or another possibility is carbon-based cones doped with nitrogen ($C_xN_y$ system), or more generally cones belonging to the $C_xB_yN_z$ system.

The synthesis of carbon cones is known to the person skilled in the art. It is summarized below. The principle of manufacture of such cones consists in using nanofibers as a substrate for deposit and to use a process of chemical vapor deposition. Nanofibers are filaments or nanotubes the diameter of which is of the order of the nanometer. The chemical vapor disposition process uses a tubular autoclave of piston type which deposits a very extensive cracking-deposit zone. The document "chemical vapour deposition of pyrolytic carbon on carbon nanotubes" (Carbon 41, 2897-2912) in the names of Allouche, Monthioux and Jacobsen describes the morphology of such cones on nanofibers as well as a process for synthesis of such cones. It is provided here to use such cones to provide a new type of electron gun for electron microscopy.

As illustrated in FIG. 3, the general structure of such a gun is that of a cold-cathode FEG. It comprises in particular an extractor anode 2 bearing a positive potential enabling electrons to be extracted from a tip 4 by pure field emission. As can be seen in FIG. 3, the tip 4, also referred to as emitter tip, is mounted at the end of a filament 6 of V-shape which is disposed inside a suppressor 8. The presence of such a suppressor is not mandatory and the scope of the present invention would not be departed from by eliminating it.

The use of a cone supported on a nanofiber as described above is provided as an electron emitter tip. Such a cone may be manipulated easily since it has a base of micrometric size. It may thus be positioned and fastened by its base at the end of a tungsten filament conventionally used in a cold FEG. The end of such a cone, or apex, has a diameter corresponding to that of the nanotube supporting it. An apex is thus found here the size of which is the order of the nanometer, that is to say comprised between 0.2 and 10 nm for example. The tip here is thus a lot smaller than that of the prior art of tungsten. The apex of the cone may be the apex of the nanotube supporting the cone, if it is still present and juts from the end of the cone.

The properties of carbon nanotubes, as regards in particular capacity to withstand current, mechanical strength and thermal durability, etc. enable an electron beam to be produced that is extremely brilliant and of which the spatial and temporal coherence marks a technological step forward in the field of transmission electron microscopy.

As is well known in the field of FEGs, the gun represented in FIG. 3 comprises a tip/extractor assembly comprising in particular the tip 4 and the extractor anode 2. This first block supplies electrons then focuses them. Next, an accelerator anode 10 accelerates the electrons provided by the first block. The gun operates according to a process in two steps. The first step of extracting electrons is the most important since it defines the properties of the beam used. The invention concerns this part of the gun. The second step, of acceleration, is not concerned by the invention. The principle of operation with regard to the extraction, even if the structure of the first block of the gun according to the invention is distinct from a first block of a cold FEG electron gun of the prior art, operates according to the same principle.

As regards the extraction, the electrons present in the tip accumulate until the Fermi energy $E_F$ is attained and, to exit the tip, must enter the vacuum separated by an energy barrier Φ. In a gun according to the present invention, a high positive voltage V, for example 3000 V, is applied at a location as close as possible to the apex in order for the field F at that apex to be as high as possible. This F is proportional to the voltage V. Due to the presence of the electric field, it is possible to model the potential in the vacuum by a negative slope which is steeper for higher extraction voltage. The electrons present at the Fermi energy may thus exit into the vacuum by passing through the barrier of potential by the tunnel effect if the barrier is sufficiently reduced by the effect of the electric field. Logically, the higher the extraction voltage V the higher the emission current. By using at the end of the emitter tip a cone such as that described above, in particular a carbon cone, the size of the emitter zone is greatly reduced and thus makes it possible to increase the value of the electric field F at the apex arising from the positive voltage V applied to the extractor anode. The field factor (corresponding to the quotient F/V) is much greater here than the field factor of the known tips of the prior art.

To produce a cathode in an electron gun according to the present invention, a conductive tip, in particular of tungsten, is microbonded onto the V-shaped filament produced from the same material. The tungsten used is for example a tungsten of which the crystal is oriented along the zone axis [310]. However, another metal, or electrical conductor, may be provided to produce the tip. A filament may be used here corresponding to the filament used as thermoelectron source. The tungsten tip is then thinned using a mixture of soda in order to produce a tip the apex of which is of the order of a about a hundred to a few hundreds of nanometers.

The filament so treated, as well as a carbon cone, are placed in an FIB instrument (FIB standing for Focused Ion Beam) equipped with a nanomanipulator and with a GIS (Gas Injection System). The base of the cone is cut by a beam of ions and then is bonded to the end of the tungsten filament taking care especially to align the tip along the axis of the tungsten filament. The positioning of the base of the cone, which was cut in advance, with the tungsten tip, is produced by virtue of the nanomanipulator. As regards the bonding, this is produced using the combined effect of the ion beam and of the injection of gaseous tungsten. The tip, comprising to tungsten tip and the carbon cone, is next placed in the first block of the electron gun at the location of which the extraction of the electrons is carried out. The vacuum is then produced within the electron gun. An ultrahigh vacuum is produced here, for example a vacuum corresponding to a pressure less than $10^{-10}$ Torr (i.e. less than approximately 1.33 $10^{-8}$ Pa).

To clean the tip of all its surface impurities, a step of autoclaving said point is provided at temperatures which may reach as high as 600° C. It is important to eliminate such impurities which would cause instabilities in the emission of electrons.

Once all these steps have been carried out, the electron gun according to the invention may be placed at the top of a column of an electron microscope, in particular a transmission or scanning electron microscope. A conventional microscope structure is to be found here in which deflection coils are placed after the electron gun in order to optically compensate for poor mechanical alignments which are necessarily present. Such an electron gun could also be used within a nanoetching device, or generally in any device requiring very local irradiation of a target by an electron beam (for example electron nanolithography).

To produce the vacuum inside the electron gun, a pump 12 is used. According to a preferred embodiment, this is an NEG type pump, that is to say a non-evaporable getter pump to enable a very high vacuum to be produced. This type of pump uses a gas trap which acts by chemisorption or by adsorption. The material used to produce this gas trap is called a getter and is for example manufactured from alloys based on zirconium or titanium.

FIG. 4 illustrates an embodiment of such an electron gun. A enclosed space 14 receives the filament 6 and the tip 4. This filament 6 is U-shaped and is carried by a cathode 16 which has two terminals 18. The free ends of the filament 6 (of U-shape) are each connected to a terminal 18.

As mentioned earlier, the filament 6 carries the tip 4 formed by a cylindrical base of which one end is machined to be pointed. The cylindrical base is fastened to the filament 6 at the base of the U. This tip 4 is for example formed from tungsten. The upper photograph in FIG. 4 illustrates the connection between the tip 4, and more specifically the cylindrical base thereof, and the filament 6.

The tip 4 is a tip support for the cone described earlier. The central photo of FIG. 4 shows the pointed end of the tip 4, which is on the opposite side to the filament 6. In this image, at relatively large scale, it is not possible to clearly distinguish the cone which becomes clearly visible on the third photo at enlarged scale (as indicated on the photographs). The pointed end 4 here bears the cone which is mounted by bonding. It is from this cone that the electrons are emitted from the described electron gun.

To extract the electrons, it may be noted that the extractor anode 2 is disposed under a base of the chamber 14. The cone is placed so as to face said base in which a small opening is made. The extractor anode 2 comes under the base of the chamber 14, and surrounds said small opening. The electrons are extracted thanks to the potential difference produced between the extractor anode 2 and the cathode 16.

Once the electrons have been extracted, they head towards the outside of the chamber 14, pass through the extractor anode 2 and pass by a focusing anode 20. This focusing anode 20 is bell-shaped here. An opening in its top enables the electrons to pass. Openings in the lateral wall are provided in particular to enable the vacuum to be present inside the bell, at the location of the passage of the electron beam.

FIG. 1 is a diagram showing the intensity of an electron beam (in mA) in relation to time (in seconds). This diagram shows that the variation in intensity, over one hour, is less than 16%.

FIG. 2 illustrates the good spatial coherence performance of the emitted beam. In this diagram, the performance in terms of spatial coherence of an electron gun according to the invention are compared with an electron gun having only a tungsten filament. The spatial coherence, as illustrated in that FIG. 2, is at least two times better than that obtained with a cold cathode FEG of the prior art. Curve C1 in this Figure represents a curve obtained with an electron gun of the prior art having a tungsten tip uniquely and curve C2 is the corresponding curve with an electron gun of the same type but in accordance with the present invention.

An electron gun according to the present invention also enables lower brilliance to be obtained. This brilliance is $1.6 \cdot 10^{-9}$ A m$^{-2}$ Sr$^{-1}$ V$^{-1}$, that is to say five times greater than an FEG of the prior art using a tip solely of tungsten.

The field factor referred to above (quotient F/V) with an electron gun according to the present invention has a value of 13000 measured on a dedicated test bed and confirmed by holography in a transmission electron microscope.

Lastly, the electron beam is stable under a high voltage of 200 kV.

On account of the geometry of the tip and cone assembly, and on account of the bonding method, the assembly so obtained is robust and limits the vibration of the tip. As written above, high brilliance is also obtained thanks to the end of the tip in carbon (or other material such as carbon doped with boron and/or nitrogen). The mounting of the cone on a tungsten tip also enables a high intensity to be obtained thanks to the high current this mounting withstands. The quality of the emitter tip and its dimensions enable low energy dispersion to be obtained in the electron beam formed. High spatial coherence can also be obtained thanks to the nanometric size of the apex. The bonding between the tungsten and the carbon as produced is a stable bond which ensures excellent stability and good durability under the ultrahigh vacuum of the device.

All these performance characteristics mean that an electron gun according to the present invention may advantageously be used in the fields of electron microscopy, and in particular transmission electron microscopy in certain applications in particular such as spectroscopy, holography and dark field holography.

What is more, it may be added that in the field of cold cathode electron sources dedicated to intensive use in electron microscopy, Niels de Jonge et al, have achieved a major advance in stressing the advantages of carbon, and in particular multi-wall nanotubes, as emitter tip (N. de Jonge et al Nature 420 (2002) 393-395; N de Jonge et al APL 85(9) 1607-1609 (2004); N de Jonge, N.J. van Druten Ultramicroscopy 95 (2003) 85-91; N de Jonge et al APL 87, 133118 p87 (2005); N de Jonge et al PRL 94, 186807 p1 (2005); N de Jonge et al Nano Letters 3, 1621-1624, (2003); C. J. Edgecombe and N de Jonge al J. Vac. Sci. Technol. B B 24(2) 869-873 (2006)). Unfortunately, an enormous number of technical problems, linked essentially to capacity to withstand voltage, mechanical stability, electrical contact of the nanotube with the filament, etc. prevents this technology from being transferred to the market of scanning electron microscopes, transmission electron microscopes, electron lithography and the like (N. de Jonge et al Nature 420 (2002) 393-395; N de Jonge et al APL 85(9) 1607-1609 (2004); N de Jonge, N. J. van Druten Ultramicroscopy 95 (2003) 85-91; N de Jonge et al APL 87, 133118 p87 (2005); N de Jonge et al PRL 94, 186807 p1 (2005); N de Jonge et al Nano Letters 3, 1621-1624, (2003); C. J. Edgecombe and N de Jonge al J. Vac. Sci. Technol. B B 24(2) 869-873 (2006)). It is in this context that the invention finds its full value. To be precise, the use of cones, in particular carbon cones, not only enables the advantages associated with the materials to be maintained, while improving the mechanical stiffness, the capacity to withstand high voltage (linked to the cone structure) as well as the excellent electrical contact deriving both from the large bonding area between the base of the cone and the conductive filament, in particular of tungsten, but also enables FIB ionic bonding of much better quality than that employed by Jonge and his associates. By using this new technology, only two hours of work suffices to transform a conventional cold tungsten gun into a carbon (or other) source described above thereby considerably increasing its properties of brilliance, coherence and current stability as described above, it being possible for the vacuum to remain unaltered.

The present invention is not limited to the embodiments described above and to the variants referred to. It also concerns all the variant embodiments within the capability of the person skilled in the art in the context of the claims given below.

Thus, the scope of the present invention will not be departed from for example if a component were to be interposed between the tungsten filament tip and the emitter tip of carbon (or other material). Interposing a spin filter may in particular be envisioned, which would enable a spin-polarized beam of electrons to be obtained.

The invention claimed is:

1. A field emission electron gun comprising:
   a supported electron emitter tip;
   an extractor anode; and
   means enabling creation of an electric potential difference between the emitter tip and the extractor anode,
   wherein the emitter tip comprises a single conductive tip support and a single end cone,
   wherein the single end cone is obtained by depositing a carbon-based material directly onto a nanofiber using a time-of-flight chemical vapor deposition process, without interposing any non-graphene-based coating layer on the nanofiber and without forming any non-graphene-based coating layer on the obtained end cone, the carbon-based material being chosen from a group comprising carbon and $C_xB_yN_z$,
   wherein the single end cone has a nanometric apex and a micrometric base and is aligned with and bonded to the conductive tip support, and
   wherein the nanofiber has a diameter that is less than 20 nm.

2. The electron gun according to claim 1, wherein the nanofiber is a nanofiber of material chosen from the group of materials comprising carbon, materials described or represented by formula $C_xB_yN_z$, C corresponding to carbon, B to boron and N to nitrogen, and materials described or represented by formula $Si_xO_y$, Si corresponding to silicon and O to oxygen.

3. The electron gun according to claim 1, wherein the nanofiber is a carbon nanotube with a diameter less than 10 nm (1 nm=$10^{-9}$ m).

4. The electron gun according to claim 1, wherein the conductive tip support is a metal tip, or is of tungsten.

5. The electron gun according to claim 1, wherein the emitter tip is supported by a metal filament of tungsten.

6. The electron gun according to claim 1, wherein the end cone is of a length between 0.5 and 10 μm ($10^{-6}$ m).

7. The electron gun according to claim 1, wherein the emitter tip and the extractor anode are disposed in a chamber in which a high vacuum is produced using a pump employing a non-evaporable getter.

8. An electron microscope comprising:
   an electron gun; and
   a column including parts of electro-optical components and means for accelerating electrons emitted by the electron gun,
   wherein the electron gun is an electron gun according to claim 1.

9. The electron microscope according to claim 8, wherein the acceleration means comprises means enabling an electric potential difference of 200 kV or less.

10. A localized electron irradiating device, or a nanoetching or nanolithography device, comprising one or more electron guns according to claim 1.

11. A method of manufacturing a field emission electron gun including
   a supported electron emitter tip;
   an extractor anode; and
   means for enabling creation of an electric potential difference between the emitter tip and the extractor anode,
   the method comprising:
   forming the emitter tip using a single conductive tip support and a single end cone having a nanometric apex and a micrometric base, by manufacturing the single end cone by depositing a carbon-based material directly onto a nanofiber using a time-of-flight chemical vapor deposition process, without interposing any non-graphene-based coating layer on the nanofiber and without forming any non-graphene-based coating layer on the obtained end cone, the carbon-based material being chosen from a group comprising carbon and $C_xB_yN_z$, the nanofiber having a diameter that is less than 20 nm, then by aligning the micrometric base of the single end cone with the single conductive tip support and bonding the micrometric base of the single end cone to the single conductive tip support.

12. The method according to claim 11, wherein the bonding bonds the micrometric base of the end cone to the tip support using a beam of metal ions generated by a focused ion beam apparatus, as an FIB apparatus, including a nanomanipulator and with a gas injection system, as a GIS.

13. The method according to claim 12, wherein the conductive tip support is of tungsten, and the FIB apparatus is adapted to generate tungsten ions and the GIS is adapted to inject gaseous tungsten.

14. The electron gun according to claim 1, wherein an entirety of the emitter tip is comprised of a single layer.

15. The electron gun according to claim 1, wherein the end cone has an exposed emitting end.

16. The electron gun according to claim 1, wherein a spin filter is interposed between the single end cone and the single conductive tip support.

* * * * *